(12) United States Patent
Sato

(10) Patent No.: US 9,247,666 B2
(45) Date of Patent: Jan. 26, 2016

(54) ELECTRONIC DEVICE, SYSTEM, ATTACHING METHOD OF ELECTRONIC DEVICE, AND APPARATUS

(71) Applicant: FUJITSU LIMITED, Kawasaki-shi, Kanagawa (JP)

(72) Inventor: Yoshiyuki Sato, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/246,602

(22) Filed: Apr. 7, 2014

(65) Prior Publication Data

US 2014/0308824 A1 Oct. 16, 2014

(30) Foreign Application Priority Data

Apr. 15, 2013 (JP) .................................. 2013-084976

(51) Int. Cl.
*H01R 12/00* (2006.01)
*H05K 1/00* (2006.01)
*H05K 7/14* (2006.01)

(52) U.S. Cl.
CPC .................................. *H05K 7/1409* (2013.01)

(58) Field of Classification Search
CPC .......... H01R 13/62966; H01R 13/629; H01R 12/7058; H01R 12/70; H05K 7/1409
USPC ............... 439/64, 61, 62, 160, 159, 327, 157, 439/372; 361/754, 798
See application file for complete search history.

(56) References Cited

U.S. PATENT DOCUMENTS 8,902,601 B2 * 12/2014 Trotman et al. ............... 361/754
2008/0045051 A1  2/2008 Sato et al.

FOREIGN PATENT DOCUMENTS

JP  1-97590  6/1989
JP  2008-47746  2/2008

* cited by examiner

*Primary Examiner* — Javaid Nasri
(74) *Attorney, Agent, or Firm* — Staas & Halsey LLP

(57) ABSTRACT

An electronic device detachably coupled to an electric terminal of an apparatus, the apparatus including an engagement portion adjacent to the electric terminal, the electronic device includes a rotation piece disposed at an insertion end portion of the electronic device, the rotation piece being rotated to engage the engagement portion disposed adjacent to the electric terminal; a connection member coupled to the rotation piece and configured to slide relative to the electronic device to rotate the rotation piece; and an operation lever coupled to the connection member and disposed at a removal end portion of the electronic device, the operation lever being interlocked with the rotation piece through the connection member.

19 Claims, 13 Drawing Sheets

ELECTRONIC DEVICE, SYSTEM, ATTACHING METHOD OF ELECTRONIC DEVICE, AND APPARATUS

CROSS-REFERENCE TO RELATED APPLICATION

This application is based upon and claims the benefit of priority from the prior Japanese Patent Application No. 2013-084976 filed on Apr. 15, 2013, the entire contents of which are incorporated herein by reference.

FIELD

The embodiment discussed herein is related to an electronic device, a system, an attaching method of the electronic device, and an apparatus.

BACKGROUND

Some of information communication apparatuses, computers, and other apparatuses are equipped with terminals, into and from which printed circuit boards are insertable and removable. Various electronic components are mounted on the printed circuit boards. The apparatuses equipped with the terminals, into and from which the printed circuit boards are insertable and removable, include, for example, apparatuses, into and from which plug-in units (PIUs) are insertable and removable, such as bookshelf-type apparatuses in which a component referred to as a back wiring board (BWB) or a back board is disposed (see, for example, Japanese Laid-open Patent Publication No. 2008-47746).

In most cases, the printed circuit boards are inserted and removed into and from the terminals provided in various apparatuses by operating operation levers provided in the printed circuit boards or the apparatuses. The operation lever is disposed, for example, when operability is considered, near an opening portion of a slot provided in a housing of the apparatus, near an end portion of the printed circuit board on the removal direction side of the printed circuit board, or the like.

In the design of various apparatuses, sometimes a member that assists in inserting and removing the printed circuit board is not disposed at a desirable position for some reason. For example, when an apparatus is not equipped with a housing, a rail that supports the printed circuit board to be inserted or removed, or the like, it may be difficult for the operation lever or the like to be disposed at a position where good operability is achievable such as a position near the opening portion of the slot provided in the housing of the apparatus or a position near an end portion of the printed circuit board on the removal direction side of the printed circuit board. When a member that assists in inserting and removing the printed circuit board is not provided, the printed circuit board may be damaged while being inserted or removed.

SUMMARY

According to an aspect of the invention, an electronic device detachably coupled to an electric terminal of an apparatus, the apparatus including an engagement portion adjacent to the electric terminal, the electronic device includes a rotation piece disposed at an insertion end portion of the electronic device, the rotation piece being rotated to engage the engagement portion disposed adjacent to the electric terminal; a connection member coupled to the rotation piece and configured to slide relative to the electronic device to rotate the rotation piece; and an operation lever coupled to the connection member and disposed at a removal end portion of the electronic device, the operation lever being interlocked with the rotation piece through the connection member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment will be described below. The embodiment below is only exemplary and does not limit the technical scope disclosed herein to forms described below.

Embodiment of Plug-In Unit

Figure 1:
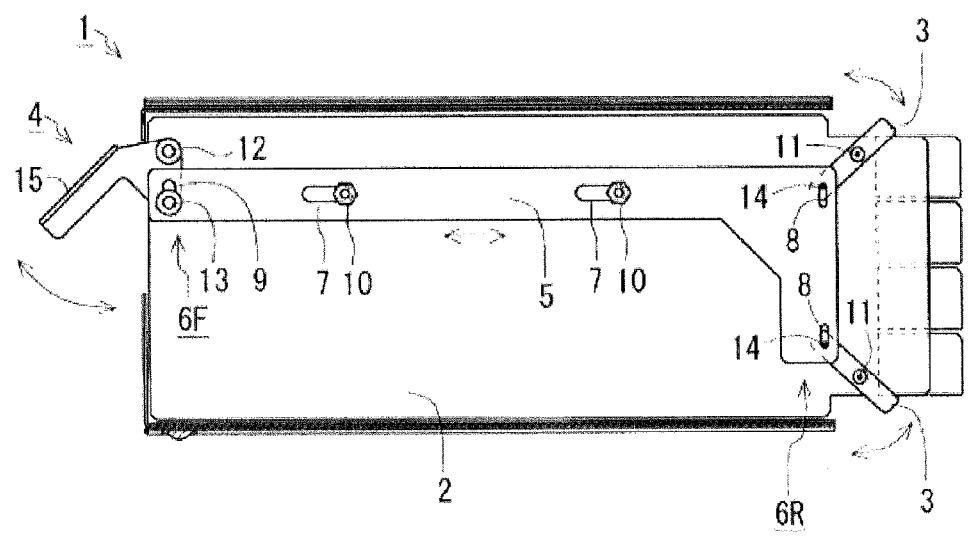
FIG. 1 is an example of a drawing of a plug-in unit according to an embodiment.

FIG. 1 is an example of a drawing of a plug-in unit (example of an "electronic device" described herein) according to an embodiment. As illustrated in FIG. 1, a plug-in unit 1 according to the embodiment includes a printed circuit board 2, rotating pieces 3, and an operation lever 4. The printed circuit board 2, on which various electronic components are mounted, is removably insertable to terminals provided in various apparatuses. The rotating pieces 3 are attached to an end portion 6R on an insertion direction side of the printed circuit board 2. When the rotating pieces 3 are rotated while being engaged with engagement portions disposed adjacent to terminals of an apparatus, the printed circuit board 2 are attached to or detached from terminals provided in a back wiring board (referred to as "BWB" hereafter) of the apparatus. The operation lever 4 is provided at an end portion 6F on a removal direction side of the printed circuit board 2. The operation lever 4 is interlocked with the rotating pieces 3 through a connecting member 5. The rotation herein refers to a movement in which a relative angle of an object is changed and not limited to a movement in which an object undergoes a full rotation of 360 degrees or a larger rotational movement.

The connecting member 5 extends in the insertion and removal direction of the plug-in unit 1. The connecting member 5 is attached to the printed circuit board 2 by two screws 10. The screws 10 are inserted through elongated holes 7 that extend in the insertion and removal direction of the plug-in unit 1. Thus, the connecting member 5 is movable relative to the printed circuit board 2 in a direction in which the holes 7 extend.

The rotating pieces 3 have, for example, a substantially rectangular shape as illustrated in FIG. 1. The rotating pieces 3 are rotatably attached to the printed circuit board 2 through screws 11 (each being an example of a member that realizes a "rotational center" herein). The screws 11 are disposed near the centers of the rotating pieces 3. The rotating pieces 3 each have a shaft 14 at one end side thereof in the longitudinal direction. The connecting member 5 has elongated holes 8, into which the shafts 14 are fitted. Thus, the rotating pieces 3 are rotated when the connecting member 5 is moved. In a rotational movement of each rotating piece 3, the screw 11 functions as the fulcrum and the shaft 14, which is fitted into the hole 8 of the connecting member 5, functions as the point of application.

The operation lever 4 has a handle 15 as illustrated, for example, in FIG. 1. The handle is held by fingers. The operation lever 4 is rotatably attached to the printed circuit board 2 through a screw 12 disposed at one end of the handle 15. The operation lever 4 includes a screw 13 on the one end side of the handle 15. The screw 13 is inserted through an elongated hole 9 formed in the connecting member 5. Thus, the operation lever 4 causes the connecting member 5 to slide in the insertion and removal direction of the plug-in unit 1 when the handle 15 is moved. Here, the screw 12 functions as the fulcrum, the screw 13 fitted into the hole 9 of the connecting member 5 functions as the point of application.

As described above, in the plug-in unit 1, the operation lever 4 and the rotating pieces 3 are interlocked with one another through the connecting member 5. Thus, the plug-in unit 1 is insertable into and removable from a slot of the apparatus in, for example, the following operations.

Figure 2A:
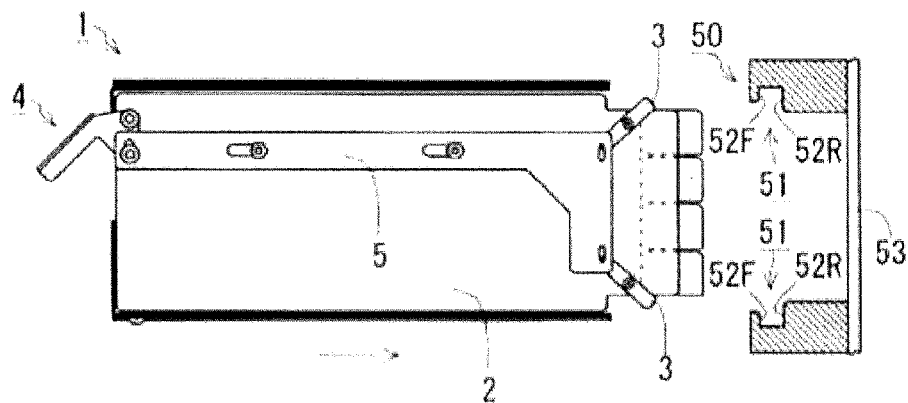
FIG. 2A is an example of a first drawing illustrating an operation in which the plug-in unit is inserted into a slot of an apparatus.

FIGS. 2A, 2B, 2C, 2D, and 2E are examples of drawings illustrating an operation in which the plug-in unit 1 is inserted into the slot of the apparatus. As illustrated in FIG. 2A, grooves 51 (each being an example of an "engagement portion" herein) and terminals are provided in a slot 50, into which the plug-in unit 1 is inserted, of the apparatus. Tip ends of the rotating pieces 3 are to be inserted into the grooves 51. Terminals, into and from which the printed circuit board 2 is inserted and removed, are disposed in a BWB 53. The grooves 51 are spaces surrounded by wall surfaces 52R positioned on a rear side of the slot 50 and wall surfaces 52F positioned on a front side of the slot 50.

Figure 2B:
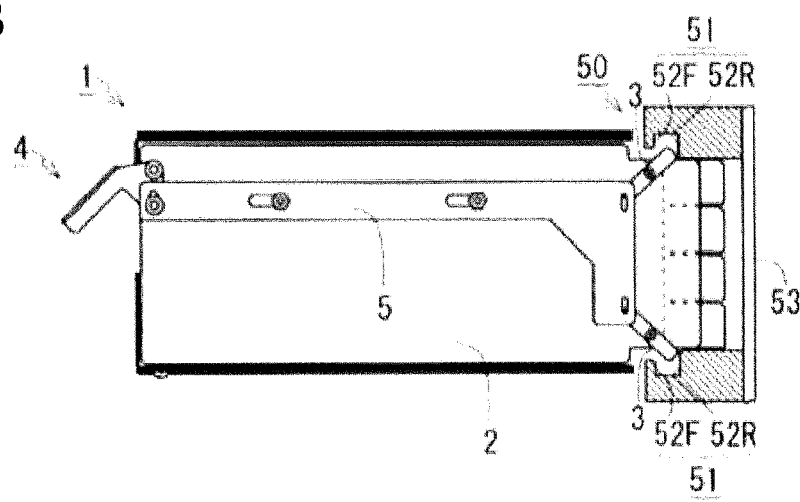
FIG. 2B is an example of a second drawing illustrating the operation in which the plug-in unit is inserted into the slot of the apparatus.

In order for an operator to insert the plug-in unit 1 into the slot 50, the operator initially pulls the operation lever 4 as illustrated in, for example, FIG. 2A, and inserts the plug-in unit 1 into the slot 50 while the rotating pieces 3 are inclined relative to the insertion and removal direction of the plug-in unit 1. When the plug-in unit 1 is inserted into the slot 50 with the operation lever 4 pulled, the tip ends of the rotating pieces 3 are soon brought into contact with the wall surfaces 52R of the respective grooves 51 as illustrated in FIG. 2B.

Figure 2C:
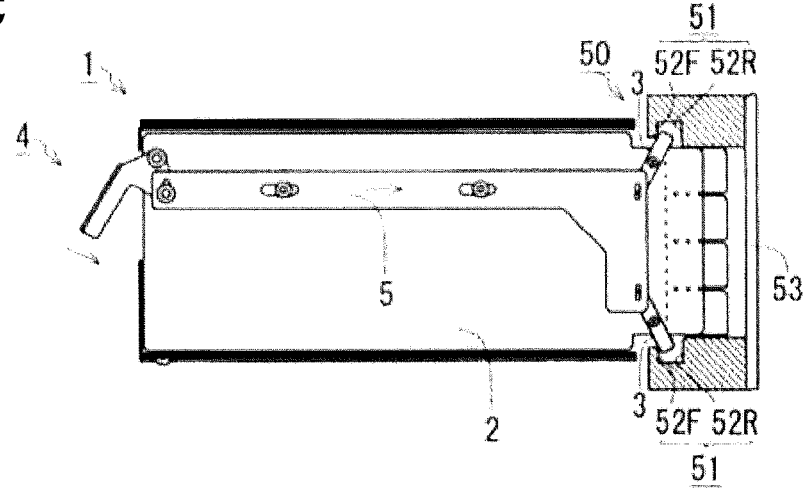
FIG. 2C is an example of a third drawing illustrating the operation in which the plug-in unit is inserted into the slot of the apparatus.
Figure 2D:
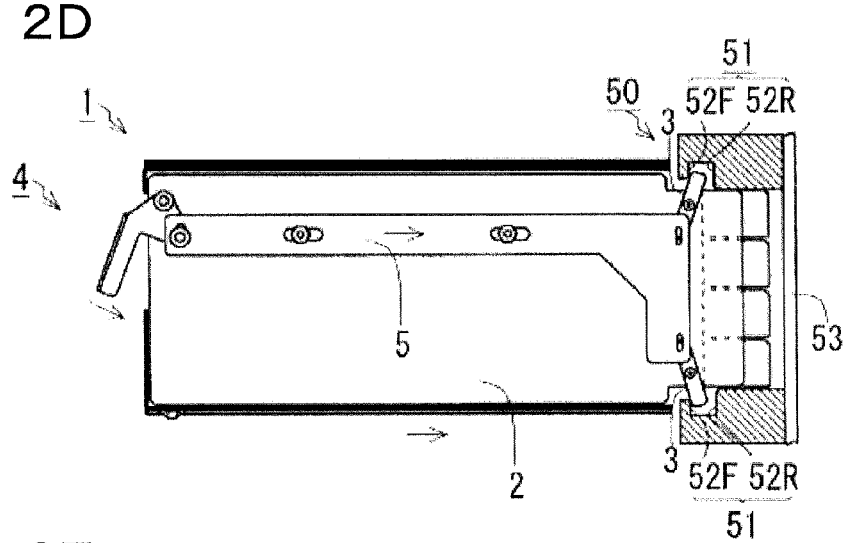
FIG. 2D is an example of a fourth drawing illustrating the operation in which the plug-in unit is inserted into the slot of the apparatus.
Figure 2E:
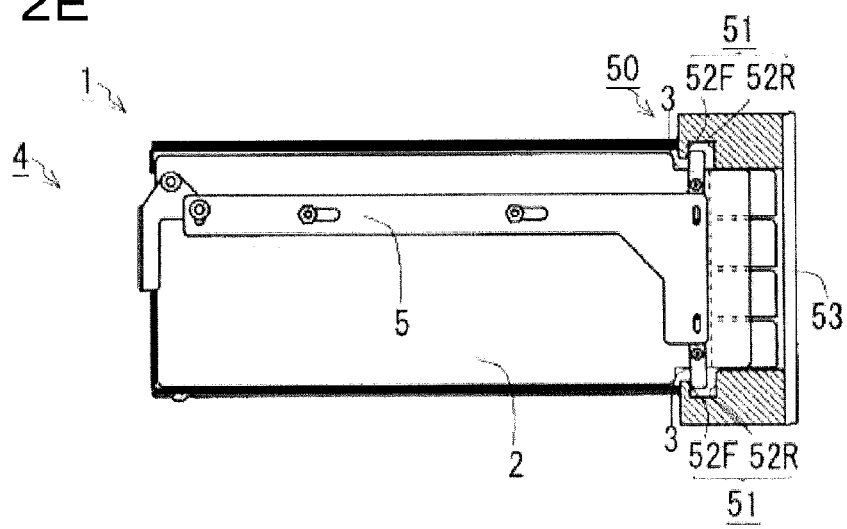
FIG. 2E is an example of a fifth drawing illustrating the operation in which the plug-in unit is inserted into the slot of the apparatus.

The operator pushes the operation lever 4 after the tip ends of the rotating pieces 3 have been brought into contact with the wall surfaces 52R of the grooves 51. When the operator pushes the operation lever 4, the rotating pieces 3, which are interlocked with the operation lever 4 through the connecting member 5, are rotated, thereby causing the tip ends of the rotating pieces 3 to be brought into contact with the wall surfaces 52F of the grooves 51 as illustrated in FIG. 2C. When the operator continues to push the operation lever 4 further, the rotating pieces 3 are urged to rotate further while the tip ends of the rotating pieces 3 are in contact with the wall surfaces 52F. Portions where the rotating pieces 3 and the respective wall surfaces 52F are in contact with one another each function as the fulcrum of the rotating piece 3, which is urged to rotate itself and move the plug-in unit 1. Thus, forces that urge the plug-in unit 1 toward the rear side of the slot 50 is applied to the plug-in unit 1 due to reactive forces caused when the rotating pieces 3 push the wall surfaces 52F. As a result, the plug-in unit 1 starts to be moved toward the rear side of the slot 50 as illustrated in FIG. 2D. When the operator finishes pushing of the operation lever 4, insertion of the plug-in unit 1 is completed as illustrated in FIG. 2E.

FIGS. 3A, 3B, 3C, and 3D are examples of drawings illustrating an operation in which the plug-in unit 1 is removed from the slot of the apparatus.

Figure 3A:
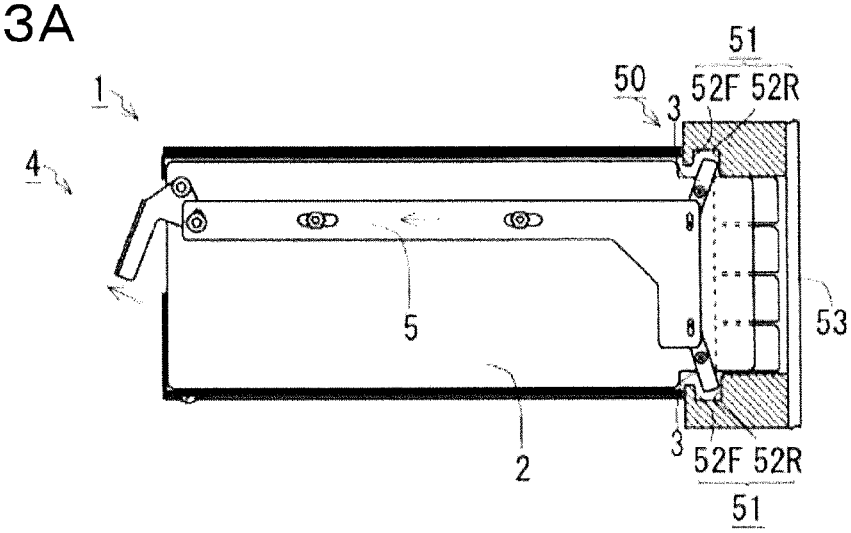
FIG. 3A is an example of a first drawing illustrating an operation in which the plug-in unit is removed from the slot of the apparatus.
Figure 3B:
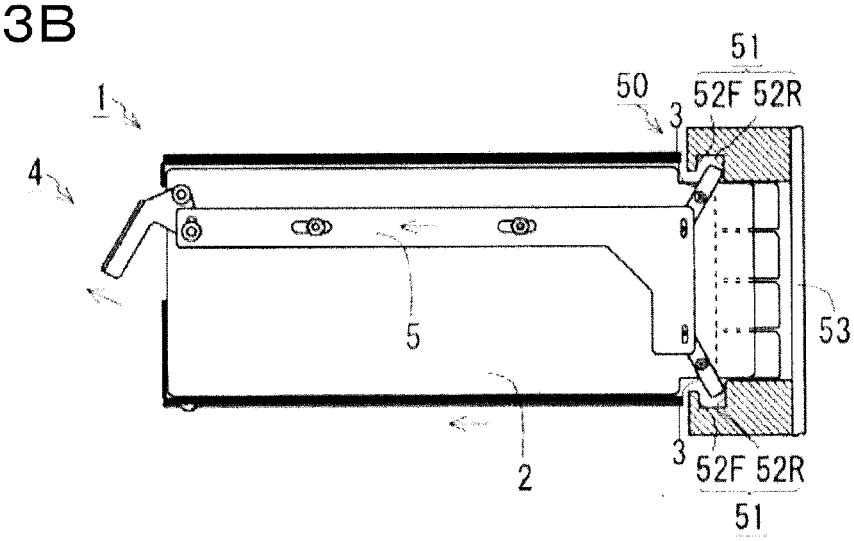
FIG. 3B is an example of a second drawing illustrating the operation in which the plug-in unit is removed from the slot of the apparatus.
Figure 3C:
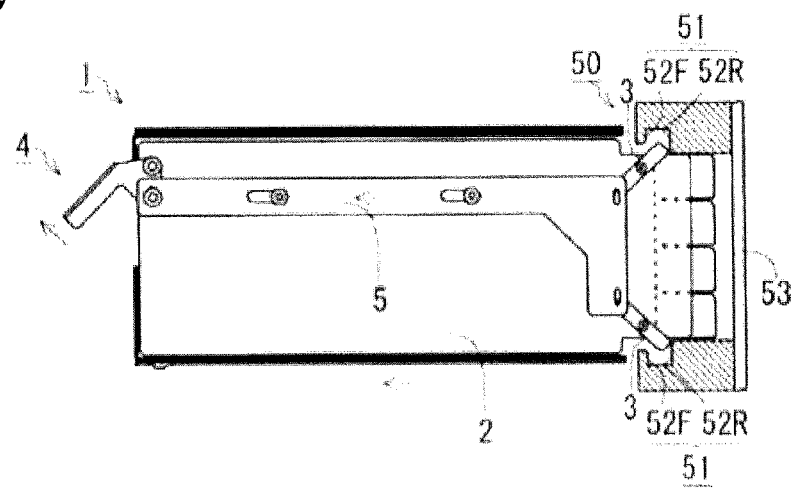
FIG. 3C is an example of a third drawing illustrating the operation in which the plug-in unit is removed from the slot of the apparatus.
Figure 3D:
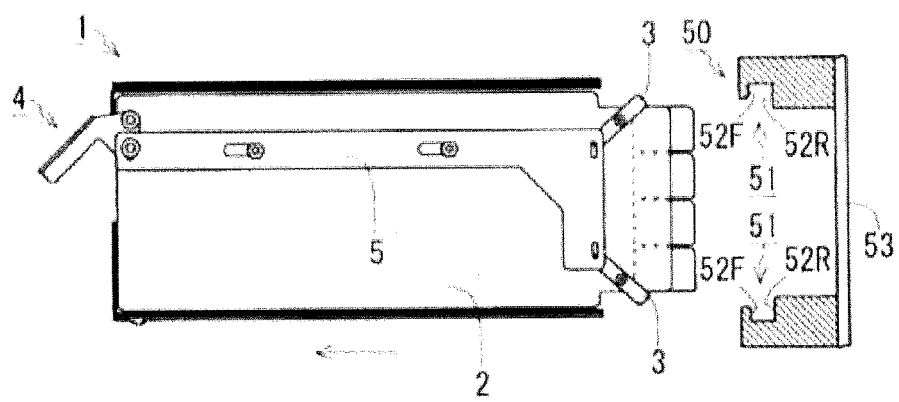
FIG. 3D is an example of a fourth drawing illustrating the operation in which the plug-in unit is removed from the slot of the apparatus.

In order for the operator to remove the plug-in unit 1 from the slot 50, the operator pulls up the operation lever 4 as illustrated in, for example, FIG. 3A. When the operator pulls up the operation lever 4, the rotating pieces 3, which are interlocked with the operation lever 4 through the connecting member 5, are rotated, thereby causing the tip ends of the rotating pieces 3 having been in contact with the wall surfaces 52F of the grooves 51 to be brought into contact with the wall surfaces 52R. When the operator continues to pull up the operation lever 4 further, the rotating pieces 3 are urged to rotate further while the tip ends of the rotating pieces 3 are in contact with the wall surfaces 52R. Portions where the rotating pieces 3 and the respective wall surfaces 52R are in contact with one another each function as the fulcrum of the rotating piece 3, which is urged to rotate itself and move the plug-in unit 1. Thus, forces that urge the plug-in unit 1 toward the front side of the slot 50 is applied to the plug-in unit 1 due to reactive forces caused when the rotating pieces 3 push the wall surfaces 52R. As a result, the plug-in unit 1 starts to be moved in the removal direction from the slot 50 as illustrated in FIG. 3B. When the operator finishes pulling up of the operation lever 4, the end portion 6R of the plug-in unit 1 is separated from the BWB 53 as illustrated in FIG. 3C. After finishing pulling up of the operation lever 4, the operator pulls the plug-in unit 1 as illustrated in FIG. 3D.

With the plug-in unit 1 according to the above-described embodiment, a mechanism for insertion and removal of the printed circuit board 2 may be realized by providing the grooves 51 in the apparatus, into and from which the plug-in unit 1 is inserted and removed. Thus, with the plug-in unit 1 according to the above-described embodiment, a mechanism for the insertion and removal of the printed circuit board 2 may be realized without reducing versatility in designing the apparatus, into and from which the printed circuit board 2 is inserted and removed.

The plug-in unit 1 according to the above-described embodiment includes two rotating pieces 3 each attached to a corresponding one of two corner portions that are parts of the end portions 6R on the insertion direction side of the printed circuit board 2. The plug-in unit 1 is moved by using the operation lever 4 through a single connecting member 5 coupled to the rotating pieces 3. Thus, the plug-in unit 1 is unlikely to incline while the plug-in unit 1 is inserted or removed. Accordingly, when, for example, contacts of the terminals are set to several different lengths so that the contacts are brought into contact with or separated from respective target contacts in an appropriate sequence, the plug-in unit 1 facilitates such sequential contact or separation. The appropriate sequence refers to a sequence in which, for example, when the plug-in unit 1 is inserted, ground lines are initially coupled, and after that, signal lines are coupled, and, when the plug-in unit 1 is removed, signal lines are initially separated, and after that, ground lines are separated. Nowadays, as electronic circuits operate at high speed, it is desirable that the size of the terminals be reduced as much as possible so as to suppress reflection occurring in portions of electronic circuitry such as portions where circuits are separated from one another. When the size of the terminals is reduced, it is unavoidable that the differences in the lengths of the contacts, the differences being set to connect and separate the contacts stepwise, are reduced. Thus, following the sequence of connection and separation becomes difficult. However, with the plug-in unit 1 according to the above-described embodiment, two rotating pieces 3 are moved by operating a single operation lever 4. The two rotating pieces 3 rotate at the same angular velocity. Thus, without depending on an accurate operation performed by the operator, the plug-in unit 1 is unlikely to incline when the plug-in unit 1 is inserted or removed. Accordingly, it is easy to follow the sequence in which the contacts are brought into contact with or separated from one another. The plug-in unit 1 according to the above-described embodiment is not limited to a plug-in unit 1 that uses the printed circuit board 2 with the contacts of the terminals, the connecting sequence of which is specified, and may be, for example, a plug-in unit 1 that is inserted or removed while power is turned off.

In the plug-in unit 1 according to the above-described embodiment, a direction in which the operation lever 4 is operated matches the insertion and removal direction of the plug-in unit 1. Thus, a force applied from the operator to the plug-in unit 1 through the operation lever 4 assists in inserting and removing the plug-in unit 1 performed by rotating the rotating pieces 3. As a result, smooth insertion and removal operations are realized.

Modifications

The form of the plug-in unit disclosed herein is not limited to a form such as the form of the plug-in unit 1 according to the above-described embodiment. The plug-in unit 1 according to the above-described embodiment may be modified, for example, as follows.

Figure 4:
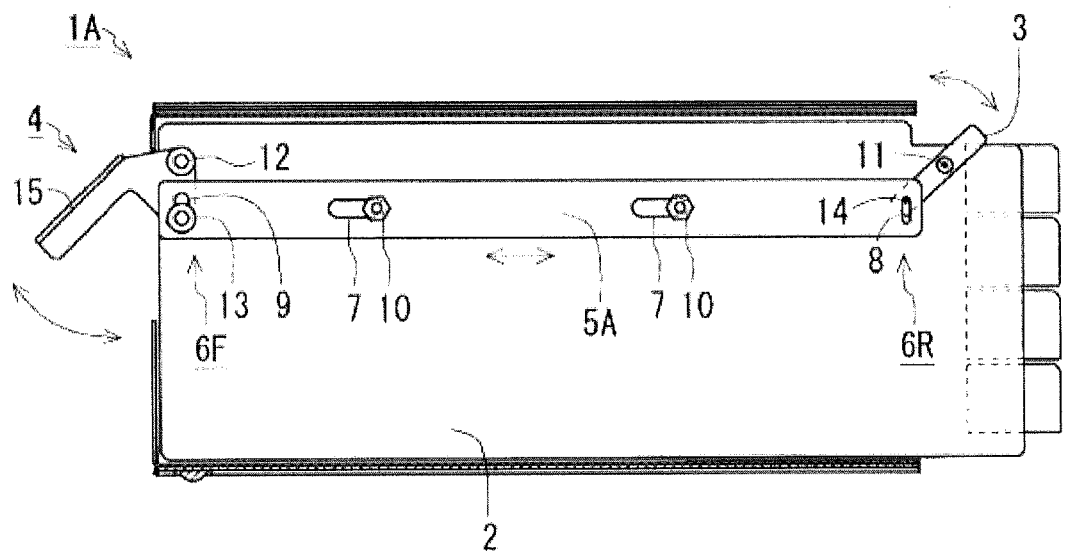
FIG. 4 is an example of a drawing of a plug-in unit according to a first modification.

FIG. 4 is an example of a drawing of a plug-in unit according to a first modification. A plug-in unit 1A according to the first modification includes the printed circuit board 2 and the operation lever 4, which are similar to those of the plug-in unit 1 according to the embodiment, and a single rotating piece 3. The rotating piece 3 is interlocked with the operation lever 4 through a connecting member 5A.

Since the plug-in unit 1A according to the first modification includes a single rotating piece instead of two, the plug-in unit 1A may incline. Despite this, the mechanism for the insertion and removal of the printed circuit board 2 may be realized without reducing versatility in designing the apparatus, into and from which the printed circuit board 2 is inserted and removed.

Figure 5:
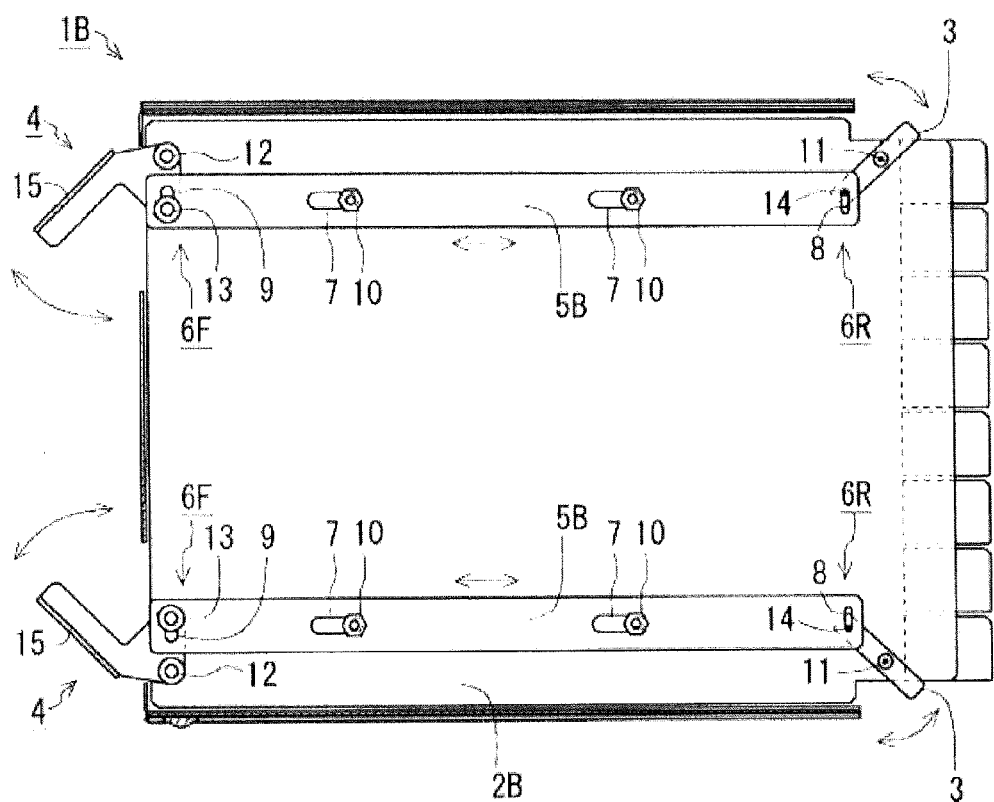
FIG. 5 is an example of a drawing of a plug-in unit according to a second modification.

FIG. 5 is an example of a drawing of a plug-in unit according to a second modification. A plug-in unit 1B according to the second modification includes two rotating pieces 3 similarly to the plug-in unit 1 according to the embodiment. The plug-in unit 1B also includes two operation levers 4 that correspond to the respective rotating pieces 3 and two connecting members 5B that correspond to the respective rotating pieces 3.

In the plug-in unit 1B according to the second modification, two rotating pieces are not operated by a single operation lever. Thus, operability is degraded compared to the embodiment described before. Despite this, the mechanism for the insertion and removal of a printed circuit board 2B may be realized without reducing versatility in designing the apparatus, into and from which the printed circuit board 2B is inserted and removed.

Figure 6:
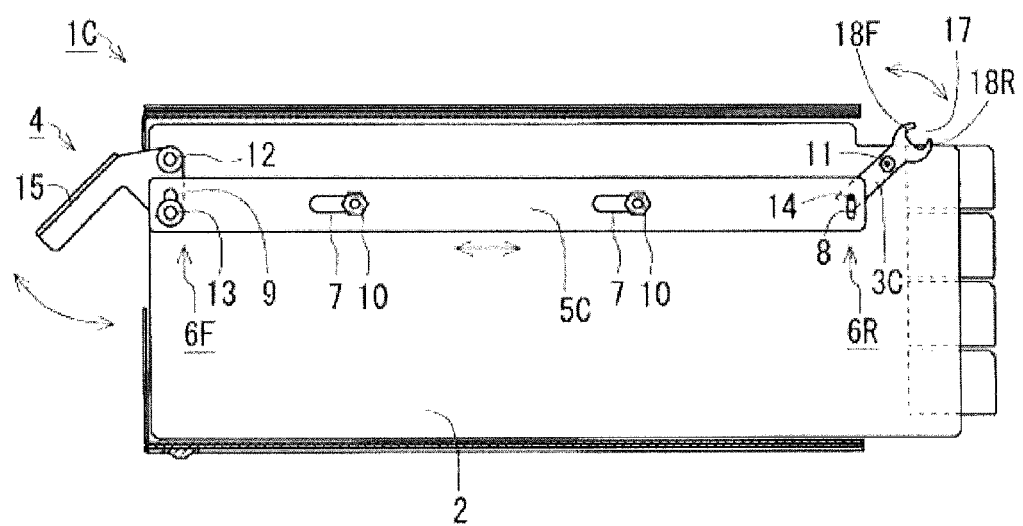
FIG. 6 is an example of a drawing of a plug-in unit according to a third modification.

FIG. 6 is an example of a drawing of a plug-in unit according to a third modification. A plug-in unit 1C according to the third modification includes the printed circuit board 2 and the operation lever 4, which are similar to those of the plug-in unit 1 according to the embodiment, and a single rotating piece 3C. A tip end of the rotating piece 3C is partly removed so as to form a U-shaped cut 17. Due to the formation of the U-shaped cut 17 at the tip end of the rotating piece 3C, a hook 18R and a hook 18F are formed. The hooks 18R and 18F are to be positioned on the rear and front sides in the slot 50C, respectively. The rotating piece 3C is interlocked with the operation lever 4 through a connecting member 5C.

Figure 7A:
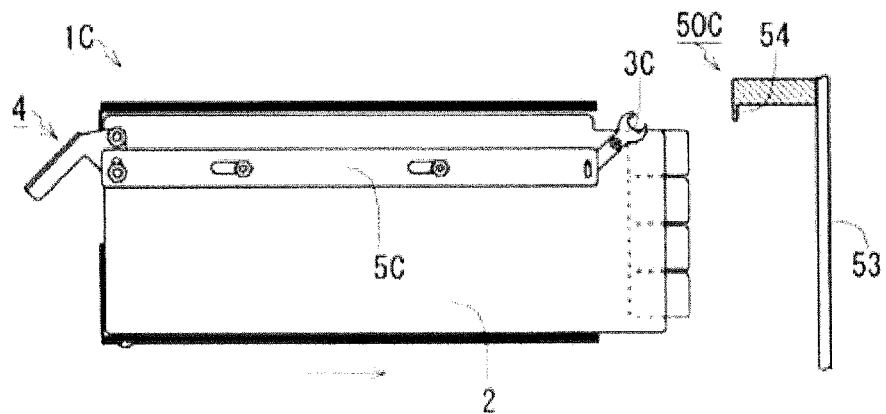
FIG. 7A is an example of a first drawing illustrating an operation in which the plug-in unit according to the third modification is inserted into a slot of an apparatus.

FIGS. 7A, 7B, 7C, 7D, and 7E are examples of drawings illustrating an operation in which the plug-in unit 1C according to the third modification is inserted into the slot of the apparatus. As illustrated in FIG. 7A, a projection 54 (an example of an "engagement portion" herein) is provided in a slot 50C of the apparatus, into which the plug-in unit 1C is inserted. The cut 17 at the tip end of the rotating piece 3C is to be engaged with the projection 54.

Figure 7B:
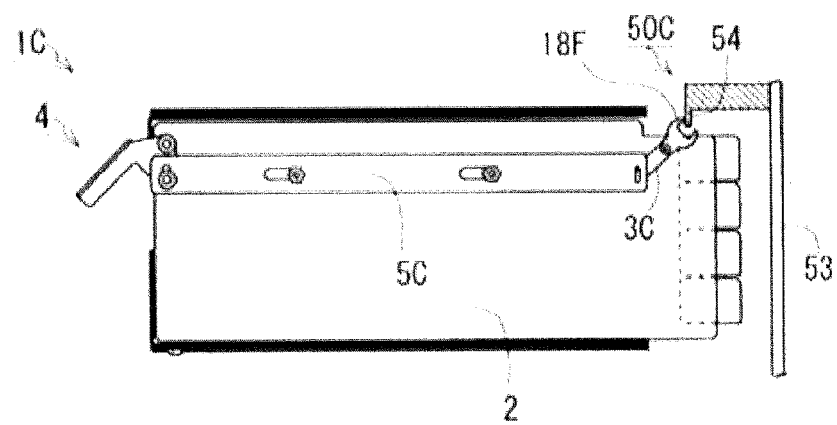
FIG. 7B is an example of a second drawing illustrating the operation in which the plug-in unit according to the third modification is inserted into the slot of the apparatus.

In order for the operator to insert the plug-in unit 1C into the slot 50C, the operator initially pulls the operation lever 4 as illustrated in, for example, FIG. 7A, and inserts the plug-in unit 1C into the slot 50C while the rotating piece 3C is inclined relative to the insertion and removal direction of the plug-in unit 1C. When the plug-in unit 1C is inserted into the slot 50C with the operation lever 4 pulled, the hook 18F at the tip end of the rotating piece 3C is soon brought into contact with the projection 54 as illustrated in FIG. 7B.

Figure 7C:
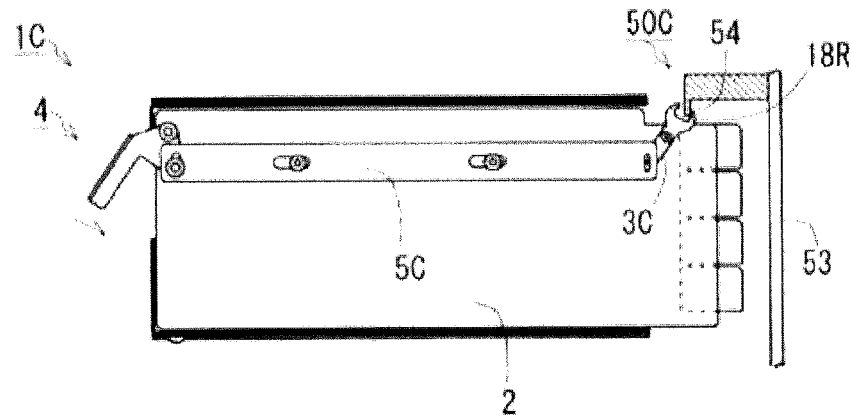
FIG. 7C is an example of a third drawing illustrating the operation in which the plug-in unit according to the third modification is inserted into the slot of the apparatus.
Figure 7D:
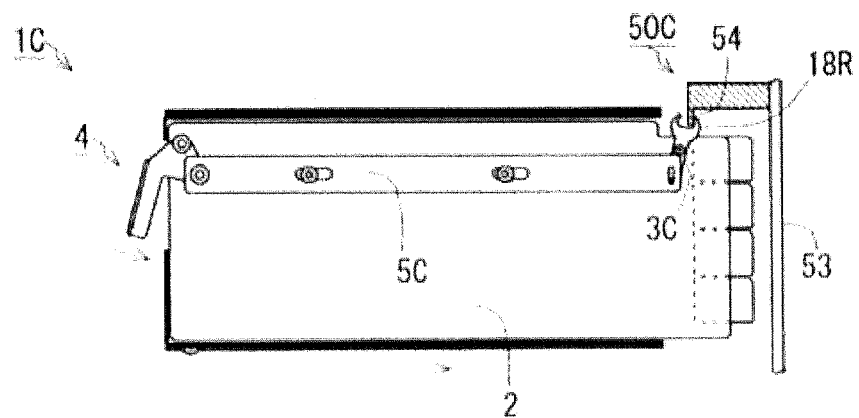
FIG. 7D is an example of a fourth drawing illustrating the operation in which the plug-in unit according to the third modification is inserted into the slot of the apparatus.
Figure 7E:
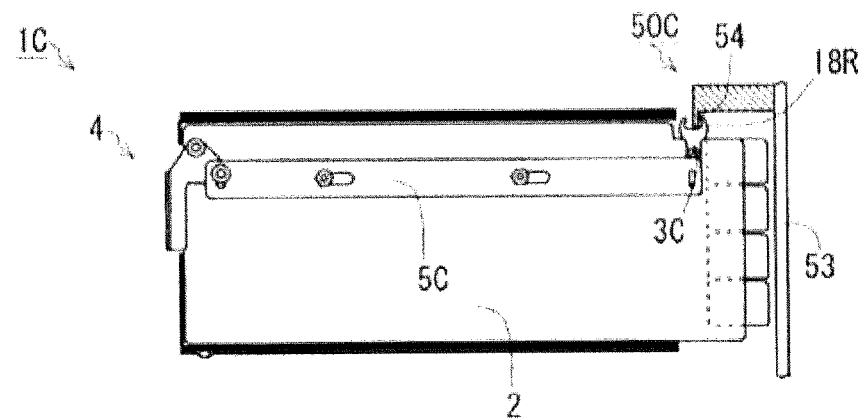
FIG. 7E is an example of a fifth drawing illustrating the operation in which the plug-in unit according to the third modification is inserted into the slot of the apparatus.

The operator pushes the operation lever 4 after the hook 18F at the tip end of the rotating piece 3C has been brought into contact with the projection 54. When the operator pushes the operation lever 4, the rotating piece 3C, which is interlocked with the operation lever 4 through the connecting member 5C, is rotated, thereby causing the hook 18R at the tip end of the rotating piece 3C to be brought into contact with the projection 54 as illustrated in FIG. 7C. When the operator continues to push the operation lever 4 further, the rotating piece 3C is urged to rotate further while the hook 18R at the tip end of the rotating piece 3C is in contact with the projection 54. Thus, a force that urges the plug-in unit 1C toward the rear side of the slot 50C is applied to the plug-in unit 1C due to a reactive force caused when the hook 18R at the tip end of the rotating piece 3C pushes the projection 54. As a result, the plug-in unit 1C starts to be moved toward the rear side of the slot 50C as illustrated in FIG. 7D. When the operator finishes pushing of the operation lever 4, insertion of the plug-in unit 1C is completed as illustrated in FIG. 7E.

Since a procedure for removal of the plug-in unit 1C is substantially reverse of the above-described insertion procedure, the description thereof is omitted.

With the plug-in unit 1C according to the third modification, by providing the simple projection 54, the mechanism for the insertion and removal of the printed circuit board 2 may be realized while improving versatility in designing the apparatus, into and from which the printed circuit board 2 is inserted and removed.

Figure 8:
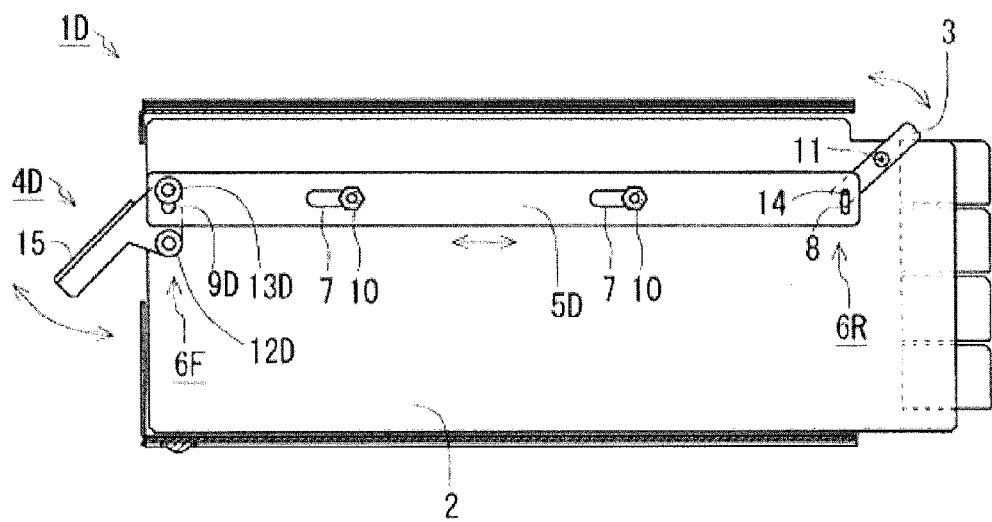
FIG. 8 is an example of a drawing of a plug-in unit according to a fourth modification.

FIG. 8 is an example of a drawing of a plug-in unit according to a fourth modification. A plug-in unit 1D according to the fourth modification includes the printed circuit board 2 and the rotating piece 3, which are similar to those of the plug-in unit 1 according to the embodiment. The plug-in unit 1D also includes an operation lever 4D and a connecting member 5D.

Similarly to the operation lever 4 of the plug-in unit 1 according to the embodiment, the operation lever 4D is interlocked with the rotating piece 3 through the connecting member 5D. However, an operational direction of the operation lever 4D is opposite to that of the operation lever 4 of the plug-in unit 1 according to the embodiment. That is, the operation lever 4D includes a screw 13D on the one end side of the handle 15. The screw 13D is inserted through an elongated hole 9D formed in the connecting member 5D. The operation lever 4D is rotatably attached to the printed circuit board 2 through a screw 12D disposed on the handle 15 side relative to the screw 13D. Thus, the operation lever 4D causes the connecting member 5D to slide in the removal direction of the plug-in unit 1D when the handle 15 is pushed. Here, the screw 12D functions as the fulcrum, and the screw 13D fitted into the hole 9D of the connecting member 5D functions as the point of application. The operation lever 4D causes the connecting member 5D to slide in the insertion direction of the plug-in unit 1D when the handle 15 is pulled up. Here, the screw 12D functions as the fulcrum, the screw 13D fitted into the hole 9D of the connecting member 5D functions as the point of application.

FIGS. 9A, 9B, 9C, 9D, and 9E are examples of drawings illustrating an operation in which the plug-in unit 1D is inserted into the slot of the apparatus.

Figure 9A:
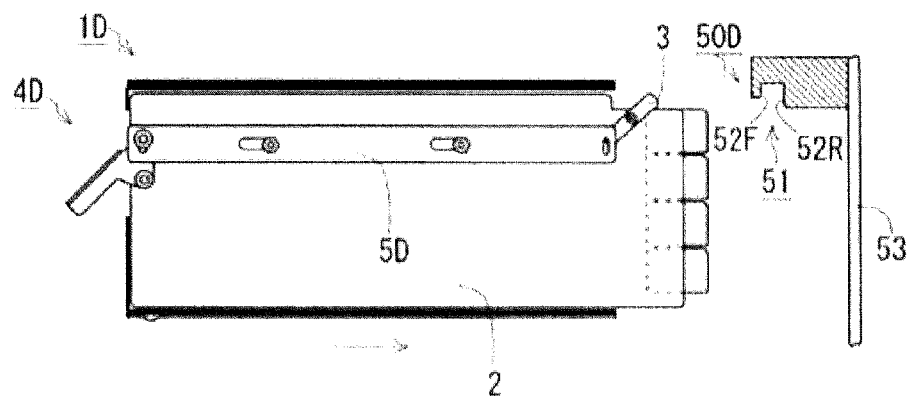
FIG. 9A is an example of a first drawing illustrating an operation in which the plug-in unit according to the fourth modification is inserted into a slot of an apparatus.
Figure 9B:
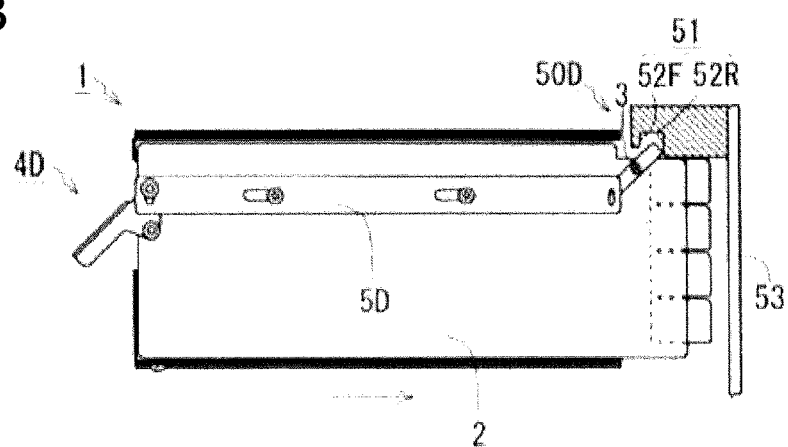
FIG. 9B is an example of a second drawing illustrating the operation in which the plug-in unit according to the fourth modification is inserted into the slot of the apparatus.

In order for the operator to insert the plug-in unit 1D into a slot 50D, the operator initially pushes the operation lever 4D as illustrated in, for example, FIG. 9A, and inserts the plug-in unit 1D into the slot 50D while the rotating piece 3 is inclined relative to the insertion and removal direction of the plug-in unit 1D. When the plug-in unit 1D is inserted into the slot 50D with the operation lever 4D pushed, the tip end of the rotating piece 3 is soon brought into contact with the wall surface 52R of the groove 51 as illustrated in FIG. 9B.

Figure 9C:
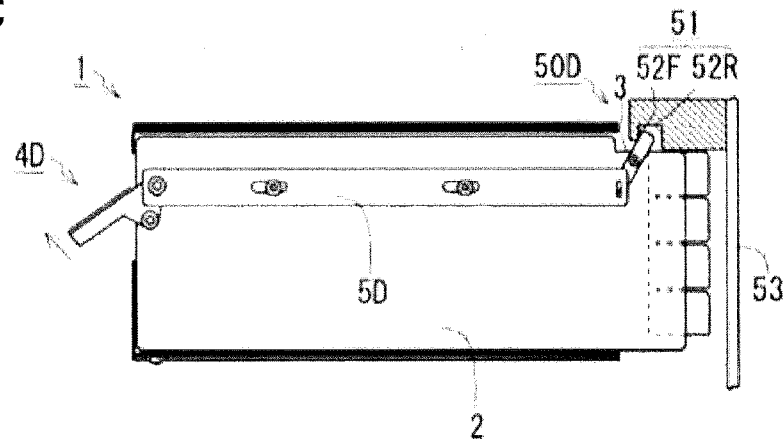
FIG. 9C is an example of a third drawing illustrating the operation in which the plug-in unit according to the fourth modification is inserted into the slot of the apparatus.
Figure 9D:
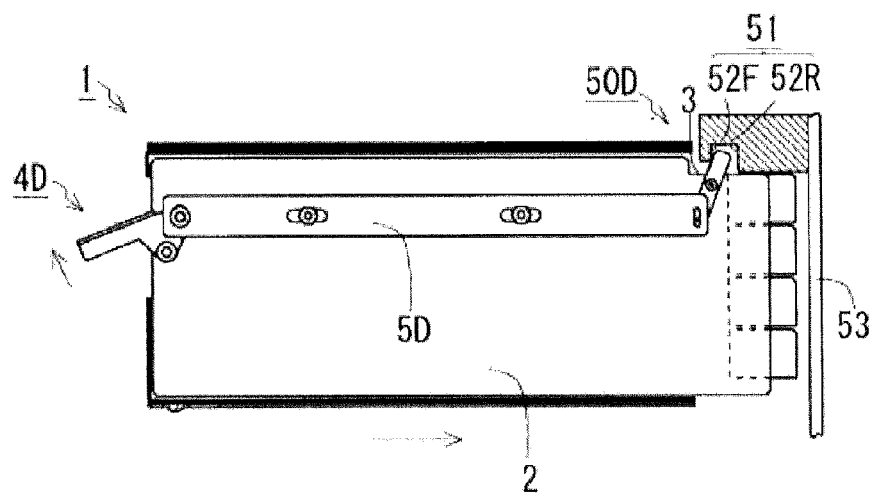
FIG. 9D is an example of a fourth drawing illustrating the operation in which the plug-in unit according to the fourth modification is inserted into the slot of the apparatus.
Figure 9E:
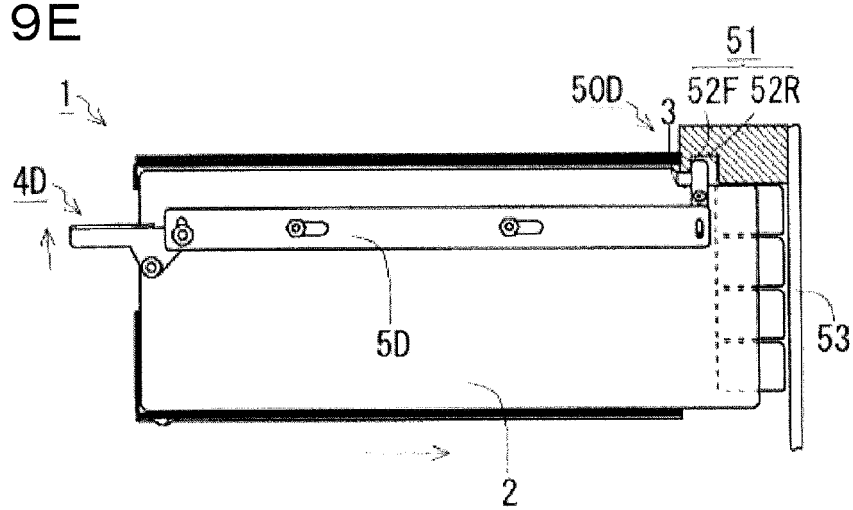
FIG. 9E is an example of a fifth drawing illustrating the operation in which the plug-in unit according to the fourth modification is inserted into the slot of the apparatus.

The operator pulls up the operation lever 4D after the tip end of the rotating piece 3 has been brought into contact with the wall surface 52R of the groove 51. When the operator pulls up the operation lever 4D, the rotating piece 3, which is interlocked with the operation lever 4D through the connecting member 5D, is rotated, thereby causing the tip end of the rotating piece 3 to be brought into contact with the wall surface 52F of the groove 51 as illustrated in FIG. 9C. When the operator continues to pull up the operation lever 4D further, the rotating piece 3 is urged to rotate further while the tip end of the rotating piece 3 is in contact with the wall surfaces 52F. Thus, a force that urges the plug-in unit 1D toward the rear side of the slot 50D is applied to the plug-in unit 1D due to a reactive force caused when the rotating piece 3 pushes the wall surface 52F. As a result, the plug-in unit 1D starts to be moved toward the rear side of the slot 50D as illustrated in FIG. 9D. When the operator finishes pulling up of the operation lever 4D, insertion of the plug-in unit 1D is completed as illustrated in FIG. 9E.

Since a procedure for removal of the plug-in unit 1D is substantially the reverse of the above-described insertion procedure, the description thereof is omitted.

The operational direction of the operation lever of the plug-in unit 1D according to the fourth modification is opposite to the insertion and removal direction. Despite this, the mechanism for the insertion and removal of the printed circuit board 2 may be realized without reducing versatility in designing the apparatus, into and from which the printed circuit board 2 is inserted and removed.

The embodiment and the modifications having been described may be appropriately combined. For example, in the embodiment and the modifications having been described, the rotating piece may have the tip end where the U-shaped cut is formed similarly to the plug-in unit 1C according to the third embodiment, or the rotating piece may have another shape.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic device detachably coupled to an electric terminal of an apparatus, the apparatus including an engagement portion adjacent to the electric terminal, the electronic device comprising:

a rotation piece disposed at an insertion end portion of the electronic device, the rotating piece being rotated to engage the engagement portion disposed adjacent to the electric terminal;

a connection member coupled to the rotation piece and configured to move relative to the electronic device along one of an insertion direction and a removal direction to rotate the rotation piece; and an operation lever coupled to the connection member and disposed at a removal end portion of the electronic device, the operation lever being interlocked with the rotation piece through the connection member.

2. The electronic device according to claim 1, wherein the rotation piece comprises two rotation pieces the two rotation pieces each being attached to a corresponding one of two corner portions of the end portion of the electronic device on an insertion direction side of the electronic device.

3. The electronic device according to claim 2, wherein the operation lever comprises two levers, the connection member comprises two connection members and the rotation piece comprises two rotation pieces where each of the two levers and each of the two connection members are provided for a corresponding one of the two rotation pieces.

4. The electronic device according to claim 1, wherein the connection member board comprises a plurality of elongated first holes to each extend in an insertion and removal direction of the electronic device, and is attached to the electronic device by first screws inserted through the respective first holes to allow the connection member to move relative to the electronic device.

5. The electronic device according to claim 4, wherein the operation lever comprises a second hole disposed at one end of the lever and is rotatably attached to the electronic device by a second screw inserted through the second hole.

6. The electronic device according to claim 5, wherein the operation lever comprises an elongated third hole spaced apart from the second hole at the one end, the operation lever being attached to the connection member by a third screw inserted through the third hole.

7. The electronic device according to claim 1, wherein the rotation piece comprises a tip end and cut at the tip end, and the engagement portion comprises a projection to be engaged with the cut when the rotation piece is engaged with the engagement portion.

8. A system, comprising:
an apparatus including an electric terminal and an engagement portion adjacent to the electric terminal; and
an electronic device detachably coupled to the electric terminal, wherein the electronic device comprising:
 a rotation piece disposed at an insertion end portion of the electronic device, the rotation piece being rotated to engage the engagement portion disposed adjacent to the electric terminal;
 a connection member coupled to the rotation piece and configured to move relative to the electronic device along one of an insertion direction and a removal direction to rotate the rotation piece; and
 an operation lever coupled to the connection member and disposed at a removal end portion of the electronic device, the operation lever being interlocked with the rotation piece through the connection member.

9. An attaching method of an electronic device, the attaching method comprising:
causing a tip end of a rotation piece to be brought into contact with an engagement portion of an apparatus, the rotation piece being provided at an end portion of the electronic device on an insertion direction side of the electronic device; and
rotating, by using a connection member coupled to the rotation piece and configured to move relative to the electronic device along an insertion direction or a removal direction, the rotation piece about a rotational center set at a portion where the rotation piece is attached to the electronic device while a portion where the rotation piece is in contact with the engagement portion functioning as a fulcrum to slide the electronic device toward the apparatus.

10. The attaching method according to claim 9,
wherein the rotation piece comprises two rotation pieces, and
wherein the causing includes causing the tip ends of the two rotation pieces to be brought into contact with the engagement portion, the two rotation pieces each being attached to a corresponding one of two corner portions of the end portion of the electronic device on the insertion direction side of the electronic device.

11. The attaching method according to claim 9, wherein sliding of the electronic device includes rotating the rotation piece by rotating an operation lever provided at an end portion of the electronic device on a removal end side of the electronic device, the operation lever being rotatable about a rotational center set at a specified position, the operation lever being interlocked with the rotation piece through a connection member.

12. An apparatus, comprising:
a printed circuit board to engage a terminal having a slot;
a first rotation member coupled to the printed circuit board to rotatably engage the slot;
a first slide member coupled to the first rotation member and configured to move relative to the printed circuit board along an insertion direction or a removal direction, and rotating the first rotation member when slid; and
a first lever coupled to the printed circuit board and the first slide member, the first; lever causing the first slide member to slide when operated.

13. The apparatus as recited in claim 12, wherein the first rotation member pulls the printed circuit board into engagement with the terminal.

14. The apparatus as recited in claim 12, wherein the first rotation member comprises a hook and the slot comprises a projection where the hook engages the projection.

15. The apparatus as recited in claim 12, wherein the rotation member comprises:
a first rotation piece positioned at a top of the printed circuit board, coupled to the first slide and engaging a first groove of the terminal; and
a second rotation piece positioned at a bottom of the printed circuit board, coupled to the first slide and engaging a second groove of the terminal.

16. The apparatus as recited in claim 12, further comprising:
a second rotation member coupled to the printed circuit board to rotatably engage the slot;
a second slide member coupled to the second rotation member, extending through the printed circuit board and rotating the second rotation member when slid; and
a second lever coupled the printed circuit board and to the second slide member to cause the second slide member to slide when operated.

17. The apparatus as recited in claim 12, wherein the first slide comprises elongated holes through which the first rotation member and the first lever are attached to allow the first slide to move in a direction parallel to a slide direction of the first slide as the first lever and first rotation member rotate.

18. The apparatus as recited in claim 12, wherein the first slide comprises elongated holes attached to the printed circuit board to guide the first slide toward and away from the terminal.

19. The apparatus as recited in claim 12, wherein the first lever comprises a handle and the handle rotates toward the printed circuit board to engage the slot.

* * * * *